(12) United States Patent
Myer et al.

(10) Patent No.: US 10,096,917 B1
(45) Date of Patent: Oct. 9, 2018

(54) COMPLIANT PIN WITH MULTIPLE ENGAGEMENT SECTIONS

(71) Applicant: TE CONNECTIVITY CORPORATION, Berwyn, PA (US)

(72) Inventors: John Mark Myer, Millersville, PA (US); Hurley Chester Moll, Hershey, PA (US); Ronald Louis Marion, Yadkinville, NC (US); Daniel Williams Fry, Jr., Elizabethtown, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/844,816

(22) Filed: Dec. 18, 2017

(51) Int. Cl.
*H01R 12/00* (2006.01)
*H01R 12/58* (2011.01)
*H01R 13/41* (2006.01)
*H01R 43/16* (2006.01)
*H01R 12/72* (2011.01)
*H01R 13/514* (2006.01)
*H05K 3/30* (2006.01)
*H01R 12/73* (2011.01)

(52) U.S. Cl.
CPC ......... *H01R 12/585* (2013.01); *H01R 12/724* (2013.01); *H01R 13/41* (2013.01); *H01R 43/16* (2013.01); *H01R 12/737* (2013.01); *H01R 13/514* (2013.01); *H05K 3/308* (2013.01)

(58) Field of Classification Search
CPC .... H01R 12/585; H01R 12/724; H01R 13/41; H01R 43/16; H01R 12/737; H01R 13/514; H05K 3/308

USPC ..................................................... 439/82, 83
See application file for complete search history.

(56) References Cited

U.S. PATENT DOCUMENTS

| | | | |
|---|---|---|---|
| 4,655,537 | A | 4/1987 | Andrews, Jr. |
| 5,564,954 | A | 10/1996 | Wurster |
| 6,066,128 | A | 5/2000 | Bahmanyar et al. |
| 7,008,272 | B2 | 3/2006 | Blossfeld |
| 7,780,483 | B1 | 8/2010 | Ravlich |
| 8,313,344 | B2 | 11/2012 | Johnescu et al. |
| 9,106,009 | B2 | 8/2015 | Zhao et al. |
| 9,431,733 | B1 | 8/2016 | Heistand et al. |

FOREIGN PATENT DOCUMENTS

EP      0387317 A1     9/1990

*Primary Examiner* — Khiem Nguyen

(57) ABSTRACT

An electrical contact includes a compliant portion having an opening extending between contact arms. A first contact arm of the contact arms has multiple resilient engagement sections extending into the opening of the compliant portion and resilient contacting sections extending from the engagement sections in a direction away from the opening. Upon insertion of the compliant portion into the hole of the substrate, the resilient engagement sections of the first contact arm engage an opposed second contact arm of the contact arms, causing each of the resilient contacting sections to move independently of the resilient engagement sections and independently of other resilient contacting sections. Each of the resilient engagement sections and the resilient contacting sections are deformed and generate independent retention forces which are combined to generate the total retention force of the compliant portion.

20 Claims, 3 Drawing Sheets

COMPLIANT PIN WITH MULTIPLE ENGAGEMENT SECTIONS

FIELD OF THE INVENTION

The present invention is directed to an electrical contact with a compliant section for making a solderless electrical connection with an electrical contact hole. In particular, the invention is directed to a compliant section which has an engagement section which allows the compliant section to generate significant retention forces to maintain the compliant section in the electrical contact hole.

BACKGROUND OF THE INVENTION

Solderless press-fit electrical contacts are commonly used for mounting an electrical connector assembly to a circuit board. One example of such an electrical contact includes a compliant contact tail that is shaped to form a pair of beams that join each other at their respective ends with a contact void between the beams. Some of these electrical contacts may be characterized as eye-of-needle electrical contacts. The beams are configured to engage an interior wall of a corresponding plated through-hole in the circuit board during a mounting operation. The configuration of the beams and the contact void allow the beams to be deflected radially inward by the interior wall as the contact tail is inserted into the plated through-hole. Outer surfaces of the beams form a frictional engagement (e.g., interference fit) with the plated through-hole. As such, an electrical connection between the electrical contact and the plated through-hole may be established without the use of solder and with a reduced likelihood of damage occurring to the plated through-hole and/or printed circuit board, which may occur when using rigid electrical contacts.

However, as the size of the contacts and the printed through holes is reduced, the holding or retention force (resistance to pull-out) is reduced, often below the minimum designated retention force. The lower retention force is largely due to the fact that thinner sheet metal must be used. The need for a considerable retention force for small contacts that fit in very small holes has been increasing as contacts have become smaller to accommodate the need for higher densities of contacts.

Accordingly, there is a need for an electrical contact with a compliant section which provides for sufficient retention force regardless of the size of the contact or the opening into which it is inserted.

SUMMARY OF THE INVENTION

An embodiment is directed to an electrical contact for insertion into a hole of a substrate. The electrical contact includes a compliant portion having an opening extending between contact arms. A first contact arm of the contact arms has multiple resilient engagement sections extending into the opening of the compliant portion and resilient contacting sections extending from the engagement sections in a direction away from the opening. Upon insertion of the compliant portion into the hole of the substrate, the resilient engagement sections of the first contact arm engage an opposed second contact arm of the contact arms, causing each of the resilient contacting sections to move independently of the resilient engagement sections and independently of other resilient contacting sections. Each of the resilient engagement sections and the resilient contacting sections are deformed and generate independent retention forces which are combined to generate the total retention force of the compliant portion.

An embodiment is directed to an electrical contact for insertion into a hole of a substrate. The electrical contact includes a connector engaging portion and a free end portion. A compliant portion extends between the connector engaging portion and the free end portion. The compliant portion has a first resilient contact arm and a second resilient contact arm. The first resilient contact arm is spaced from the second resilient contact arm by an opening. The first contact arm has a first engagement section and a second engagement section. The first engagement section and the second engagement section are spaced apart and extend into the opening of the compliant portion. A first resilient contact section extends from the connector engaging portion to the first engagement section, a second resilient contact section extends from the first engagement section to the second engagement section, and a third resilient contact section extends from the second engagement section to the free end portion. Upon insertion of the compliant portion into the hole of the substrate, the first engagement section and the second engagement section of the first contact arm engage the second contact arm to prevent further movement of the first engagement section and the second engagement section, causing the first resilient contact section, the second resilient contact section and the third resilient contact section to move independently of each other and independently of the first engagement section and the second engagement section. The total retention force of the compliant portion is generated by the total of the forces generated by the first engagement section, the second engagement section, the first resilient contact section, the second resilient contact section and the third resilient contact section.

An embodiment is directed to a method of generating retention force from an electrical contact inserted into an opening of a substrate. The method includes: inserting a compliant portion of the electrical contact into the opening of the substrate; forcing a first contact arm and a second contact arm of the compliant portion toward each other; engaging a first engagement section of the first contact arm with the second contact arm to prevent further movement of the first engagement section; engaging a second engagement section of the first contact arm with the second contact arm to prevent further movement of the second engagement section; moving a first resilient contact section of the first contact arm, a second resilient contact section of the first contact arm and a third resilient contact section of the first contact arm of the compliant portion to move independently of each other and independently of the first engagement section of the first contact arm and the second engagement section of the first contact arm; and generating a total retention force of the compliant portion by combining the forces generated by the first engagement section of the first contact arm, the second engagement section of the first contact arm, the first resilient contact section of the first contact arm, the second resilient contact section of the first contact arm and the third resilient contact section of the first contact arm.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features, the scope of the invention being defined by the claims appended hereto.

Figure 1:
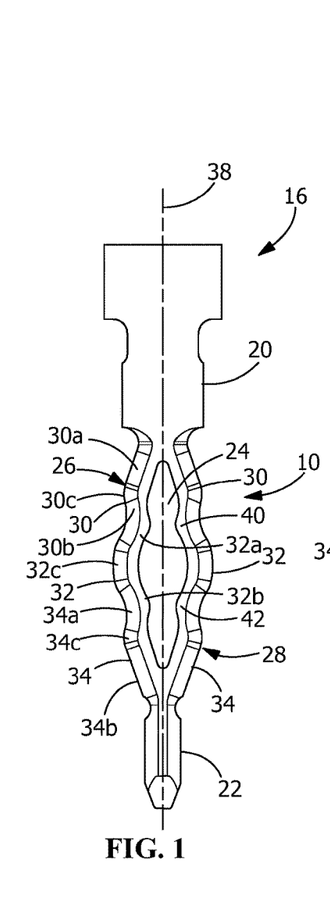
FIG. 1 is a two-dimensional orthogonal view of a first illustrative embodiment of a compliant pin according the present invention, the compliant pin is shown prior to insertion into a plated through-hole of a printed circuit board.
Figure 2:
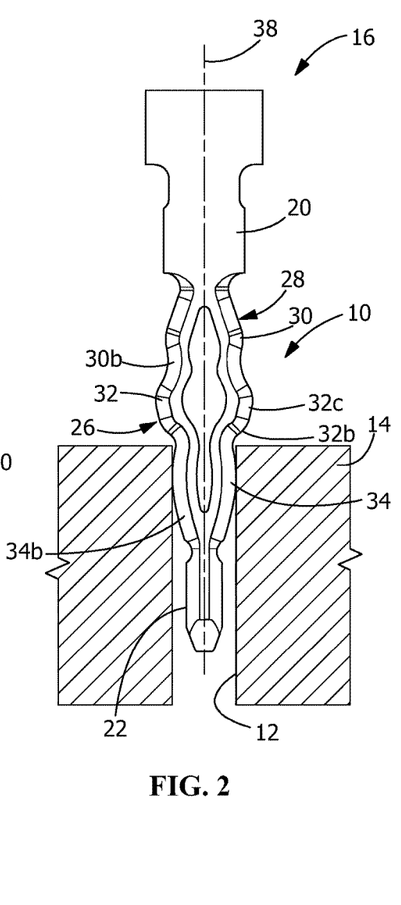
FIG. 2 is a cross-sectional view of the compliant pin of FIG. 1 partially inserted into the printed circuit board.
Figure 3:
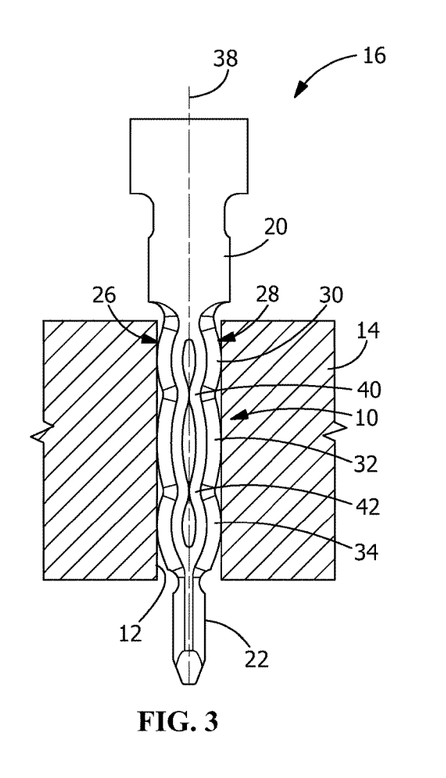
FIG. 3 is a cross-sectional view of the compliant pin of FIG. 1 fully inserted into the printed circuit board.

Compliant section or portion 10, shown in FIGS. 1 through 3, may be included into any one of several different electrical contacts or pins 16 which are mounted in holes, such as a plated through-holes 12 or the like, in a substrate, such as a printed circuit board 14 or the like. The compliant section 10 is that part of an electrical contact or pin 16 which is driven into plated through-hole 12 and retained therein by the resilient characteristics of the section 10. The force required to insert the compliant portion 10 into hole 12 and the force required to withdraw the compliant portion 10 from the hole are important characteristics of the compliant portion 10. The configuration and operation of the compliant portion 10 contribute to both the force required to insert the compliant portion 10 into hole 12 and the force required to withdraw the compliant portion 10.

The compliant section or portion 10 includes a first contact arm 26 and a second contact arm 28 positioned between a connector engaging portion 20 and free end portion 22. As these portions 20, 22 can be of any shape and are not directly relevant to the present invention, they are not shown in detail. As best shown in FIG. 1, the free end portion 22 has a diameter that is less than the diameter of the hole 12 of the substrate 14 and less than the width of the compliant portion 10 prior to the compliant portion 10 being inserted into the hole 12.

The pin 16 and compliant portion 10 are formed by stamping a flattened portion of stock (not shown), resulting in the compliant portion 10 having an opening 24 positioned between a first contact arm 26 and a second contact arm 28 and extending between the connector engaging portion 20 and the free end portion 22. The compliant portion 10 extends between the connector engaging portion 20 and the free end portion 22.

In the illustrative embodiment shown in FIGS. 1 through 3, the second contact arm 28 is a mirror image of the first contact arm 26. Each contact arm 26, 28 has a first resilient contact section 30, a second resilient contact section 32 and a third resilient contact section 34. Each contact arm 26, 28 also has a first engagement section 40 and a second engagement section 42.

The first resilient contact sections 30 include first segments 30a and second segments 30b. The first segments 30a are attached to the connector engaging portion 20 and extend downwardly and obliquely outward from a longitudinal axis 38 of the electrical contact 16. The second segments 30b are attached to the first segments 30a by arcuate transition portions 30c. The second segments 30b extend downwardly and obliquely toward the longitudinal axis 38 of the electrical contact 16. The first engagement sections 40 are positioned at the ends of the second segments 30b which are spaced from the arcuate transition portions 30c.

The second resilient contact sections 32 include third segments 32a and fourth segments 32b. The third segments 32a are attached to the first engagement sections 40 and extend downwardly and obliquely outward from the longitudinal axis 38 of the electrical contact 16. The fourth segments 32b are attached to the third segments 32a by arcuate transition portions 32c. The fourth segments 32b extend downwardly and obliquely toward the longitudinal axis 38 of the electrical contact 16. The second engagement sections 42 are positioned at the ends of the fourth segments 32b which are spaced from the arcuate transition portions 32c.

The third resilient contact sections 34 include fifth segments 34a and sixth segments 34b. The fifth segments 34a are attached to the second engagement sections 42 and extend downwardly and obliquely outward from the longitudinal axis 38 of the electrical contact 16. The sixth segments 34b are attached to the fifth segments 34a by arcuate transition portions 34c. The sixth segments 34b extend downwardly and obliquely toward the longitudinal axis 38 of the electrical contact 16. The free end portion 22 is positioned at the ends of the sixth segments 34b which are spaced from the arcuate transition portions 34c.

As shown in FIG. 1, the first engagement section 40 and the second engagement section 42 extend into or narrow the opening 24. The first resilient contact sections 30, the second resilient contact sections 32 and the third resilient contact sections 34 extend outward from the first engagement section 40 and the second engagement section 42 to widen the opening 24.

In this illustrative embodiment, the first resilient contact sections 30 are equal or have the same length as the third resilient contact sections 34. In addition, the second resilient contact sections 32 are generally equal to or have the same length as the first resilient contact sections 30. However, other configurations may be used without departing from the scope of the invention.

The outwardly facing surfaces of the contact arms 26, 28 are curved from side to side, i.e., transverse to the axis 38 of contact 16. The curvature may be symmetrical or non-symmetrical.

The overall configuration of the contact arms 26, 28 are such as to define an angular bowed compliant section with a disruption therein occasioned by the first engagement sections 40 and the second engagement sections 42.

The insertion of compliant section 10 into plated through-hole 12 is illustrated in FIGS. 2 and 3. With reference to FIG. 2, as the contact 16 is pushed downward, the contact arms 26, 28 enter the hole 12 and the sixth segments 34b of the third resilient contact sections 34 engage the wall of the hole 12. The engagement of the sixth segments 34b with the wall of the hole 12 causes the sixth segments 34b and the third resilient contact sections 34 of the contact arms 26, 28 to resiliently deform inward, toward the axis 38.

Due to the size of the hole 12 and the width of the compliant section 10, as insertion continues, the third resilient contact sections 34 of the contact arms 26, 28 continue to deform inwardly until the second engagement section 42 of the first resilient arm 26 and the second engagement section 42 of the second resilient arm 28 are moved into engagement, thereby preventing further inward movement of the second engagement sections 42. It should be noted that the size of the opening 12 and the width of the compliant section 10 cause the total deflection of the first and second arms 26, 28 to vary.

With the second engagement sections 42 engaged, the second engagement sections 42 effectively become a fixed point, causing further movement or deformation of the third resilient contact sections 34 to be independent of the further movement or deformation of the resilient contact sections 30 and second resilient contact sections 32.

As insertion continues, the third resilient contact sections 34 continue to be moved or resiliently deformed and provide increased insertion forces and retention forces as the third resilient contact sections 34 are deformed. The forces are accentuated in that the attachment of third resilient contact sections 34 to the free end portion 22 is fixed and the engagement of the second engagement sections 42 causes the second engagement sections 42 to be fixed.

With continued insertion, the fourth segments 32b of the second resilient contact sections 32 engage the wall of the hole 12. The engagement of the fourth segments 32b with the wall of the hole 12 causes the fourth segments 32b and the second resilient contact sections 32 of the contact arms 26, 28 to resiliently deform inward, toward the axis 38.

Due to the size of the hole 12 and the width of the compliant section 10, as insertion continues, the second resilient contact sections 32 of the contact arms 26, 28 continue to deform inwardly until the first engagement section 40 of the first resilient arm 26 and the first engagement section 40 of the second resilient arm 28 are moved into engagement, thereby preventing further inward movement of the first engagement sections 40.

With the first engagement sections 40 engaged, the first engagement sections 40 effectively become a fixed point, causing further movement or deformation of the second resilient contact sections 32 to be independent of the further movement or deformation of the first resilient contact sections 30.

As insertion continues, the second resilient contact sections 32 continue to be moved or resiliently deformed and provide increased insertion forces and retention forces as the second resilient contact sections 32 are deformed. The forces are accentuated in that the attachment of second resilient contact sections 32 to the engagement of the second engagement sections 42 causes the second engagement sections 42 to be fixed and the engagement of the first engagement sections 40 causes the first engagement sections 40 to be fixed.

With continued insertion, the second segments 30b of the first resilient contact sections 30 engage the wall of the hole 12. The engagement of the second segments 30b with the wall of the hole 12 causes the second segments 30b and the first resilient contact sections 30 of the contact arms 26, 28 to resiliently deform inward, toward the axis 38.

As insertion continues, the first resilient contact sections 30 continue to be moved or resiliently deformed and provide increased insertion forces and retention forces as the first resilient contact sections 30 are deformed. The forces are accentuated in that the attachment of first resilient contact sections 30 to the engagement of the first engagement sections 40 causes the first engagement sections 40 to be fixed and the engagement of the first engagement sections 40 causes the first engagement sections 40 to be fixed and the attachment of first resilient contact sections 30 to the connector engaging portion 20 is fixed.

Depending upon the size of the opening or hole into which the compliant portion 10 is inserted, portions of the first resilient contact section 30, the second resilient contact section 32, and/or the third resilient contact section 34 are provided in electrical engagement with the plated through-hole.

The use of the first engagement sections 40 and the second engagement sections 42 allows the compliant portion 10 to operate as a traditional eye of the needle compliant portion when first inserted into the opening 12, thereby allowing for low insertion forces when the compliant portion 10 is initially inserted. However, once the engagement section 40, 42 are in engagement, the resilient contact sections 30, 32, 34 act as independent spring members, thereby providing significantly more retention force than can be generated by known compliant pins, as represented by curve 702 of FIG. 7.

As the first resilient contact sections 30, the second resilient contact sections 32 and the third resilient contact sections 34 are moved inward about fixed points or are compressed to form a less curved path, the overall length of the compliant portion 10 may increase.

Figure 4:
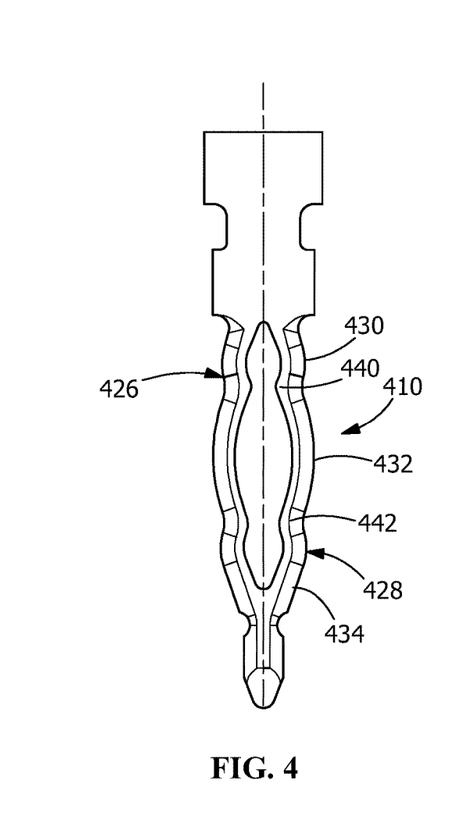
FIG. 4 is a two-dimensional orthogonal view of a second illustrative embodiment of a compliant pin according the present invention.

A second illustrative compliant section or portion 410 is shown in FIG. 4. Similar to the embodiment shown in FIG. 1, each contact arm 426, 428 has a first resilient contact section 430, a second resilient contact section 432 and a third resilient contact section 434. Each contact arm 426, 428 also has a first engagement section 440 and a second engagement section 442.

In this embodiment, the size of the second resilient contact sections 432 is greater than the size of first resilient contact sections 430 and third resilient contact sections 434. This allows the forces associated with the second resilient contact sections 432 to be different than the forces associated with first resilient contact sections 430 and third resilient contact sections 434 and different than the forces associated with second resilient contact sections 432. However, the insertion and operation of the compliant portion 410 is similar to that described with respect to FIGS. 1 through 3.

The use of the first engagement sections 440 and the second engagement sections 442 allows the compliant portion 410 to operate as a traditional eye of the needle compliant portion when first inserted into the opening, thereby allowing for low insertion forces when the compliant portion 410 is initially inserted. However, once the engagement section 440, 442 are in engagement, the resilient contact sections 430, 432, 434 act as independent spring members, thereby providing significantly more retention force than can be generated by known compliant pins, as represented by curve 704 of FIG. 7.

Figure 5:
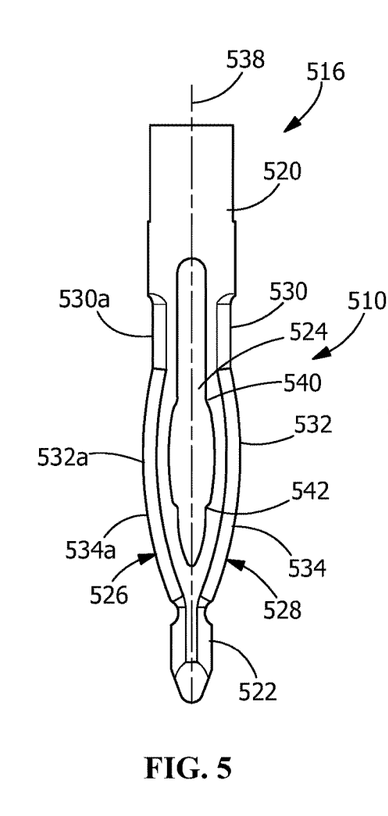
FIG. 5 is a two-dimensional orthogonal view of a third illustrative embodiment of a compliant pin according the present invention.

A third illustrative compliant section or portion 510 is shown in FIG. 5. The compliant section or portion 510 includes a first contact arm 526 and a second contact arm 528 positioned between a connector engaging portion 520 and free end portion 522. As these portions 520, 522 can be of any shape and are not directly relevant to the present invention, they are not shown in detail.

The pin 516 and compliant portion 510 are formed by stamping a flattened portion of stock (not shown), resulting in the compliant portion 510 having an opening 524 positioned between the first contact arm 526 and the second contact arm 528 and extending between the connector engaging portion 520 and the free end portion 522. The compliant portion 510 extends between the connector engaging portion 520 and the free end portion 522.

The second contact arm 528 is a mirror image of the first contact arm 526. Each contact arm 526, 528 has a first resilient contact section 530, a second resilient contact section 532 and a third resilient contact section 534. Each contact arm 526, 528 also has a first engagement section 540 and a second engagement section 542.

The first resilient contact sections 530 include first segments 530a. The first segments 530a are attached to the connector engaging portion 520 and extend downwardly and are essentially parallel to a longitudinal axis 538 of the electrical contact 516. The first engagement sections 540 are positioned at the ends of the first segments 530a.

The second resilient contact sections 532 include second segments 532a. The second segments 532a are attached to the first engagement sections 540 and extend downwardly and outwardly in an arcuate configuration from the longitudinal axis 538 of the electrical contact 516. The second engagement sections 542 are positioned at the ends of the second segments 532a which are spaced from the second engagement sections 542.

The third resilient contact sections 534 include third segments 534a. The third segments 534a are attached to the second engagement sections 542 and extend downwardly and obliquely inward toward the longitudinal axis 538 of the electrical contact 516. The free end portion 522 is positioned at the ends of the third segments 534a which are spaced from the first engagement sections 540.

The first engagement section 540 and the second engagement section 542 extend into or narrow the opening 524. The overall configuration of the contact arms 526, 528 are such as to define an angular bowed compliant section with a disruption therein occasioned by the first resilient contact sections 530.

The outwardly facing surfaces of the contact arms 526, 528 are curved from side to side, i.e., transverse to the axis 538 of contact 516. The curvature may be symmetrical or non-symmetrical.

During insertion of compliant section 510 into plated through-hole 512, the contact 516 is pushed downward, the contact arms 526, 528 enter the hole and the third segments 534a of the third resilient contact sections 534 engage the wall of the hole. The engagement of the third segments 534a with the wall of the hole causes the third segments 534a and the third resilient contact sections 534 of the contact arms 526, 528 to resiliently deform inward, toward the axis 538.

Due to the size of the hole and the width of the compliant section 510, as insertion continues, the third resilient contact sections 534 of the contact arms 526, 528 continue to deform inwardly until the second engagement section 542 of the first resilient arm 526 and the second engagement section 542 of the second resilient arm 528 are moved into engagement, thereby preventing further inward movement of the second engagement sections 542. It should be noted that the size of the opening and the width of the compliant section 510 cause the total deflection of the first and second arms 526, 528 to vary.

With the second engagement sections 542 engaged, the second engagement sections 542 effectively become a fixed point, causing further movement or deformation of the third resilient contact sections 534 to be independent of the further movement or deformation of the first resilient contact sections 530 and second resilient contact sections 532.

As insertion continues, the third resilient contact sections 534 continue to be moved or resiliently deformed and provide increased insertion forces and retention forces as the third resilient contact sections 534 are deformed. The forces are accentuated in that the attachment of third resilient contact sections 534 to the free end portion 522 is fixed and the engagement of the second engagement sections 542 causes the second engagement sections 542 to be fixed.

With continued insertion, the second segments 532a of the second resilient contact sections 532 engage the wall of the hole. The engagement of the second segments 532a with the wall of the hole causes the second segments 532a and the second resilient contact sections 532 of the contact arms 526, 528 to resiliently deform inward, toward the axis 538.

Due to the size of the hole and the width of the compliant section 510, as insertion continues, the second resilient contact sections 532 of the contact arms 526, 528 continue to deform inwardly until the first engagement section 540 of the first resilient arm 526 and the first engagement section 540 of the second resilient arm 528 are moved into engagement, thereby preventing further inward movement of the first engagement sections 540.

With the first engagement sections 540 engaged, the first engagement sections 540 effectively become a fixed point, causing further movement or deformation of the second resilient contact sections 532 to be independent of the further movement or deformation of the first resilient contact sections 530.

As insertion continues, the second resilient contact sections 532 continue to be moved or resiliently deformed and provide increased insertion forces and retention forces as the second resilient contact sections 532 are deformed. The forces are accentuated in that the attachment of second resilient contact sections 532 to the engagement of the second engagement sections 542 causes the second engagement sections 542 to be fixed and the engagement of the first engagement sections 540 causes the first engagement sections 540 to be fixed.

With continued insertion, the first segments 530a of the first resilient contact sections 530 engage the wall of the hole. The engagement of the first segments 530a with the wall of the hole causes the first segments 530a and the first resilient contact sections 530 of the contact arms 526, 528 to resiliently deform inward, toward the axis 538.

As insertion continues, the first resilient contact sections 530 continue to be moved or resiliently deformed and provide increased insertion forces and retention forces as the first resilient contact sections 530 are deformed. The forces are accentuated in that the attachment of first resilient contact sections 530 to the engagement of the first engagement sections 540 causes the first engagement sections 540 to be fixed and the engagement of the first engagement sections 540 causes the first engagement sections 540 to be fixed and the attachment of first resilient contact sections 530 to the connector engaging portion 520 is fixed.

Depending upon the size of the opening or hole into which the compliant portion 510 is inserted, portions of the first resilient contact section 530, the second resilient contact section 532, and/or the third resilient contact section 534 are provided in electrical engagement with the plated through-hole.

The use of the first engagement sections 540 and the second engagement sections 542 allows the compliant portion 510 to operate as a traditional eye of the needle compliant portion when first inserted into the opening, thereby allowing for low insertion forces when the compliant portion 510 is initially inserted. However, once the engagement section 540, 542 are in engagement, the resilient contact sections 530, 532, 534 act as independent spring members, thereby providing significantly more retention force than can be generated by known compliant pins.

As the second resilient contact sections 532, and the third resilient contact sections 534 are moved inward about fixed points or are compressed to form a less curved path, the overall length of the compliant portion 510 may increase.

Figure 6:
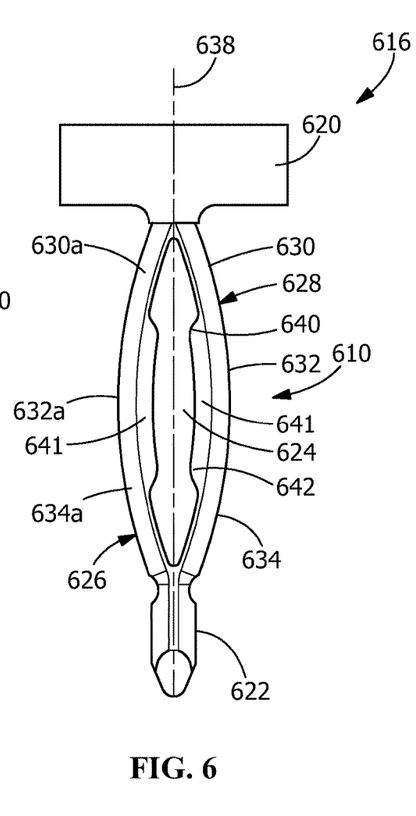
FIG. 6 is a two-dimensional orthogonal view of a fourth illustrative embodiment of a compliant pin according the present invention.

A fourth illustrative compliant section or portion 610 is shown in FIG. 6. The compliant section or portion 610 includes a first contact arm 626 and a second contact arm 628 positioned between a connector engaging portion 620 and free end portion 622. As these portions 620, 622 can be of any shape and are not directly relevant to the present invention, they are not shown in detail.

The pin 616 and compliant portion 610 are formed by stamping a flattened portion of stock (not shown), resulting in the compliant portion 610 having an opening 624 positioned between the first contact arm 626 and the second contact arm 628 and extending between the connector engaging portion 620 and the free end portion 622. The compliant portion 610 extends between the connector engaging portion 620 and the free end portion 622.

The second contact arm 628 is a mirror image of the first contact arm 626. Each contact arm 626, 628 has a first resilient contact section 630, a second resilient contact section 632 and a third resilient contact section 634. Each contact arm 626, 628 also has a first engagement section 640 and a second engagement section 642.

The first resilient contact sections 630 include first segments 630a. The first segments 630a are attached to the connector engaging portion 620 and extend downwardly and outwardly in an arcuate configuration from the longitudinal axis 638 of the electrical contact 616. The first engagement sections 640 are positioned at the ends of the first segments 630a.

The second resilient contact sections 632 include second segments 632a. The second segments 632a are attached to the first engagement sections 640 and extend downwardly in an arcuate configuration from the longitudinal axis 638 of the electrical contact 616. The second engagement sections 642 are positioned at the ends of the second segments 632a which are spaced from the second engagement sections 642.

The third resilient contact sections 634 include third segments 634a. The third segments 634a are attached to the second engagement sections 642 and extend downwardly and inwardly in an arcuate configuration toward the longitudinal axis 638 of the electrical contact 616. The free end portion 622 is positioned at the ends of the third segments 634a which are spaced from the first engagement sections 640.

The first engagement section 640 and the second engagement section 642 extend into or narrow the opening 624. Reinforcing sections 641 may also be provided between the first engagement section 640 and the second engagement section 642 to provide additional strength to the second resilient contact sections 632. The overall configuration of the contact arms 626, 628 are such as to define an angular bowed compliant section.

The outwardly facing surfaces of the contact arms 626, 628 are curved from side to side, i.e., transverse to the axis 638 of contact 616. The curvature may be symmetrical or non-symmetrical.

During insertion of compliant section 610 into plated through-hole 612, the contact 616 is pushed downward, the contact arms 626, 628 enter the hole and the third segments 634a of the third resilient contact sections 634 engage the wall of the hole. The engagement of the third segments 634a with the wall of the hole causes the third segments 634a and the third resilient contact sections 634 of the contact arms 626, 628 to resiliently deform inward, toward the axis 638.

Due to the size of the hole and the width of the compliant section 610, as insertion continues, the third resilient contact sections 634 of the contact arms 626, 628 continue to deform inwardly until the second engagement section 642 of the first resilient arm 626 and the second engagement section 642 of the second resilient arm 628 are moved into engagement, thereby preventing further inward movement of the second engagement sections 642. It should be noted that the size of the opening and the width of the compliant section 610 cause the total deflection of the first and second arms 626, 628 to vary.

With the second engagement sections 642 engaged, the second engagement sections 642 effectively become a fixed point, causing further movement or deformation of the third resilient contact sections 634 to be independent of the further movement or deformation of the resilient contact sections 630 and second resilient contact sections 632.

As insertion continues, the third resilient contact sections 634 continue to be moved or resiliently deformed and provide increased insertion forces and retention forces as the third resilient contact sections 634 are deformed. The forces are accentuated in that the attachment of third resilient contact sections 634 to the free end portion 622 is fixed and the engagement of the second engagement sections 642 causes the second engagement sections 642 to be fixed.

With continued insertion, the second segments 632a of the second resilient contact sections 632 engage the wall of the hole. The engagement of the second segments 632a with the wall of the hole causes the second segments 632a and the second resilient contact sections 632 of the contact arms 626, 628 to resiliently deform inward, toward the axis 638.

Due to the size of the hole and the width of the compliant section 610, as insertion continues, the second resilient contact sections 632 of the contact arms 626, 628 continue to deform inwardly until the first engagement section 640 of the first resilient arm 626 and the first engagement section 640 of the second resilient arm 628 are moved into engagement, thereby preventing further inward movement of the first engagement sections 640.

With the first engagement sections 640 engaged, the first engagement sections 640 effectively become a fixed point, causing further movement or deformation of the second resilient contact sections 632 to be independent of the further movement or deformation of the first resilient contact sections 630.

As insertion continues, the second resilient contact sections 632 continue to be moved or resiliently deformed and provide increased insertion forces and retention forces as the second resilient contact sections 632 are deformed. The forces are accentuated in that the attachment of second resilient contact sections 632 to the engagement of the second engagement sections 642 causes the second engagement sections 642 to be fixed and the engagement of the first engagement sections 640 causes the first engagement sections 640 to be fixed.

With continued insertion, the first segments 630a of the first resilient contact sections 630 engage the wall of the hole. The engagement of the first segments 630a with the wall of the hole causes the first segments 630a and the first resilient contact sections 630 of the contact arms 626, 628 to resiliently deform inward, toward the axis 638.

As insertion continues, the first resilient contact sections 630 continue to be moved or resiliently deformed and provide increased insertion forces and retention forces as the first resilient contact sections 630 are deformed. The forces are accentuated in that the attachment of first resilient contact sections 630 to the engagement of the first engagement sections 640 causes the first engagement sections 640 to be fixed and the engagement of the first engagement sections 640 causes the first engagement sections 640 to be fixed and the attachment of first resilient contact sections 630 to the connector engaging portion 620 is fixed.

Depending upon the size of the opening or hole into which the compliant portion 610 is inserted, portions of the first resilient contact section 630, the second resilient contact section 632, and/or the third resilient contact section 634 are provided in electrical engagement with the plated through-hole.

The use of the first engagement sections 640 and the second engagement sections 642 allows the compliant portion 610 to operate as a traditional eye of the needle compliant portion when first inserted into the opening, thereby allowing for low insertion forces when the compliant portion 610 is initially inserted. However, once the engagement section 640, 642 are in engagement, the resilient contact sections 630, 632, 634 act as independent spring members, thereby providing significantly more retention force than can be generated by known compliant pins, as represented by curve 706 of FIG. 7.

As the second resilient contact sections 632, and the third resilient contact sections 634 are moved inward about fixed points or are compressed to form a less curved path, the overall length of the compliant portion 610 may increase.

Figure 7:
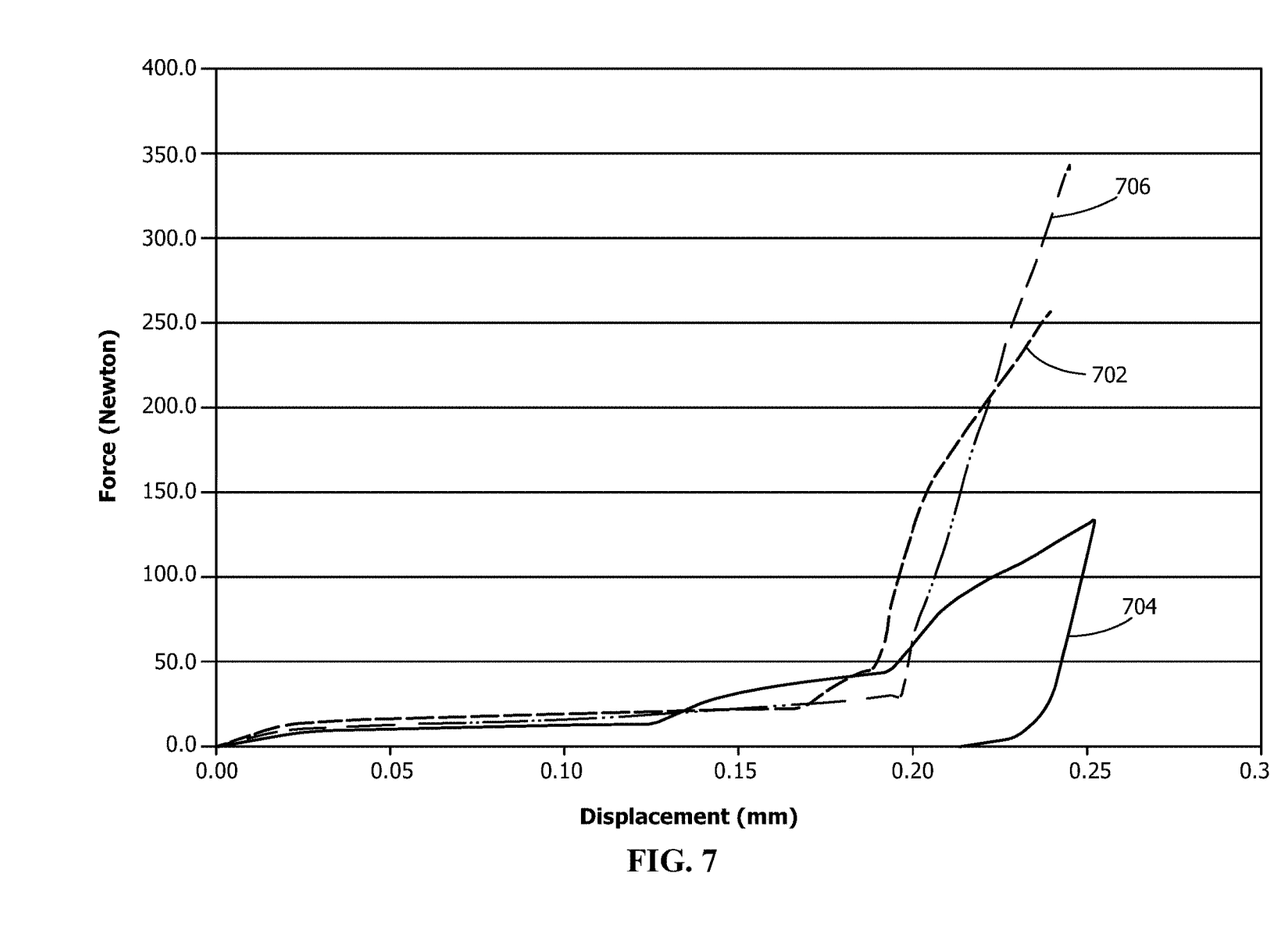
FIG. 7 is a graph showing the force v. deflection plots for the embodiments.

FIG. 7 shows representative force versus displacement plots for each embodiment. These plots illustrate that the retention force for each embodiment remains strong, as sufficient recoverable energy is obtained due to the configuration of the compliant portions, thereby allowing the compliant portion of the present invention to be used in harsh environments in which vibration and the like are present, for example, in automotive applications. Curve 702 is representative of the force versus displacement plot for the illustrative embodiment shown in FIG. 1. Curve 704 is representative of the force versus displacement plot for the illustrative embodiment shown in FIG. 4. Curve 706 is representative of the force versus displacement plot for the illustrative embodiment shown in FIG. 6. While specific embodiments are shown, other embodiments may have different force versus displacement plots without departing from the scope of the invention.

The method of generating retention force from an electrical contact inserted into an opening of a substrate according to the present invention includes inserting a compliant portion of the electrical contact into the opening of the substrate; forcing a first contact arm and a second contact arm of the compliant portion toward each other; engaging a first engagement section of the first contact arm with the second contact arm to prevent further movement of the first engagement section; engaging a second engagement section of the first contact arm with the second contact arm to prevent further movement of the second engagement section; moving a first resilient contact section of the first contact arm, a second resilient contact section of the first contact arm and a third resilient contact section of the first contact arm of the compliant portion to move independently of each other and independently of the first engagement section of the first contact arm and the second engagement section of the first contact arm; and generating a total retention force of the compliant portion by combining the forces generated by the first engagement section of the first contact arm, the second engagement section of the first contact arm, the first resilient contact section of the first contact arm, the second resilient contact section of the first contact arm and the third resilient contact section of the first contact arm.

The method may also include: engaging a first engagement section of the second contact arm with the first engagement section of the first contact arm to prevent further movement of the first engagement section; engaging a second engagement section of the second contact arm with the second engagement section of the first contact arm to prevent further movement of the second engagement section; moving a first resilient contact section of the second contact arm, a second resilient contact section of the second contact arm and a third resilient contact section of the second contact arm of the compliant portion to move independently of each other and independently of the first engagement section of the second contact arm and the second engagement section of the second contact arm; and generating a total retention force of the compliant portion by combining the forces generated by the first engagement section of the first contact arm, the second engagement section of the first contact arm, the first resilient contact section of the first contact arm, the second resilient contact section of the first contact arm, the third resilient contact section of the first contact arm, the first engagement section of the second contact arm, the second engagement section of the second contact arm, the first resilient contact section of the second contact arm, the second resilient contact section of the second contact arm and the third resilient contact section of the second contact arm.

The compliant portion, as described herein, can be used with pins of all sizes and all materials, including with 0.50 mm×0.40 mm size pins in which the material stock thickness is 0.40 mm or less. In addition, as the resilient contact arms have a longer lengths than known compliant portions, the compliant portions of the present invention minimize the possibility of fracturing occurring when the compliant portions are inserted into the hole.

While the invention has been described with reference to a preferred embodiment, it will be understood by those skilled in the art that various changes may be made and equivalents may be substituted for elements thereof without departing from the spirit and scope of the invention as defined in the accompanying claims. In particular, it will be clear to those skilled in the art that the present invention may be embodied in other specific forms, structures, arrangements, proportions, sizes, and with other elements, materials and components, without departing from the spirit or essential characteristics thereof. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. An electrical contact for insertion into a hole of a substrate, the electrical contact comprising:
   a compliant portion having an opening extending between contact arms;
   a first contact arm of the contact arms having multiple resilient engagement sections extending into the opening of the compliant portion and resilient contacting sections extending from the engagement sections in a direction away from the opening;
   wherein upon insertion of the compliant portion into the hole of the substrate, the resilient engagement sections of the first contact arm engage an opposed second contact arm of the contact arms, causing each of the resilient contacting sections to move independently of the resilient engagement sections and independently of other resilient contacting sections;
   wherein each of the resilient engagement sections and the resilient contacting sections are deformed and generate independent retention forces which are combined to generate the total retention force of the compliant portion.

2. The electrical contact as recited in claim 1, wherein the electrical contact has a connector engaging portion and a free end portion, the compliant portion extending between the connector engaging portion and the free end portion, the free end portion having diameters that are less than a diameter of the hole of the substrate.

3. The electrical contact as recited in claim 2, wherein the resilient engagement sections includes a first resilient engagement section and a second resilient engagement section, wherein the first resilient engagement section and the second resilient engagement section of the first contact arm engage an opposed contact arm of the contact arms.

4. The electrical contact as recited in claim 3, wherein the resilient contact sections include a second resilient contact section which extends between the first resilient engagement section and the second resilient engagement section, wherein as the first resilient engagement section and the second resilient engagement section of the first contact arm engage the opposed contact arm of the contact arms, the second resilient contact section behaves as a simply supported spring.

5. The electrical contact as recited in claim 4, wherein the resilient contact sections include a first resilient contact section which extends between the connector engaging portion of the electrical contact and the first resilient engagement, wherein as the first resilient engagement section of the first contact arm engages the second contact arm of the contact arms, the first resilient contact section behaves as a first cantilevered spring, the first resilient contact section and the second resilient contact section operate independently when the first resilient engagement section of the first contact arm engages the second contact arm of the contact arms, causing the second resilient contact section and the first resilient contact section to generate independent retention forces.

6. The electrical contact as recited in claim 5, wherein the resilient contact sections include a third resilient contact section which extends between the second resilient engagement and the free end portion of the electrical contact, wherein as the second resilient engagement section of the first contact arm engages the second contact arm of the contact arms, the third resilient contact section behaves as a second cantilevered spring, the third resilient contact section and the first resilient engagement section operate independently when the second resilient engagement section of the first contact arm engages the second contact arm of the contact arms, causing the second resilient contact section and the third resilient contact section to generate independent retention forces.

7. The electrical contact as recited in claim 4, wherein the first resilient engagement section and the second resilient engagement section have arcuate configurations.

8. The electrical contact as recited in claim 3, wherein the second resilient contact section has an arcuate configuration.

9. The electrical contact as recited in claim 6, wherein the opening extends from the connector engaging portion to the free end portion.

10. The electrical contact as recited in claim 6, wherein the second contact arm extends from the connector engaging portion to the free end portion and is a mirror image of the first contact arm.

11. The electrical contact as recited in claim 6, wherein the first resilient contact section and the third resilient contact section have different lengths.

12. The electrical contact as recited in claim 6, wherein the first resilient contact section and the third resilient contact section have the same length.

13. The electrical contact as recited in claim 1, wherein outside surfaces of the contact arms which face away from the opening have a rounded configuration.

14. An electrical contact for insertion into a hole of a substrate, the electrical contact comprising:
   a connector engaging portion and a free end portion, a compliant portion extending between the connector engaging portion and the free end portion;
   the compliant portion having a first resilient contact arm and a second resilient contact arm, the first resilient contact arm is spaced from the second resilient contact arm by an opening;
   the first contact arm has a first engagement section and a second engagement section, the first engagement section and the second engagement section are spaced apart and extend into the opening of the compliant portion, a first resilient contact section extends from the connector engaging portion to the first engagement section, a second resilient contact section extends from the first engagement section to the second engagement section, a third resilient contact section extends from the second engagement section to the free end portion;
   wherein upon insertion of the compliant portion into the hole of the substrate, the first engagement section and the second engagement section of the first contact arm engage the second contact arm to prevent further movement of the first engagement section and the second engagement section, causing the first resilient contact section, the second resilient contact section and the third resilient contact section to move independently of each other and independently of the first engagement section and the second engagement section;

wherein the total retention force of the compliant portion is generated by the total of the forces generated by the first engagement section, the second engagement section, the first resilient contact section, the second resilient contact section and the third resilient contact section.

15. The electrical contact as recited in claim 14, wherein the second contact arm is a mirror image of the first contact arm.

16. The electrical contact as recited in claim 15, wherein the opening extends from the connector engaging portion to the free end portion.

17. The electrical contact as recited in claim 16, wherein the first resilient contact section and the third resilient contact section have different lengths.

18. The electrical contact as recited in claim 16, wherein the first resilient contact section and the third resilient contact section have the same length.

19. A method of generating retention force from an electrical contact inserted into an opening of a substrate, the method comprising:
    inserting a compliant portion of the electrical contact into the opening of the substrate;
    forcing a first contact arm and a second contact arm of the compliant portion toward each other;
    engaging a first engagement section of the first contact arm with the second contact arm to prevent further movement of the first engagement section;
    engaging a second engagement section of the first contact arm with the second contact arm to prevent further movement of the second engagement section;
    moving a first resilient contact section of the first contact arm, a second resilient contact section of the first contact arm and a third resilient contact section of the first contact arm of the compliant portion to move independently of each other and independently of the first engagement section of the first contact arm and the second engagement section of the first contact arm;
    generating a total retention force of the compliant portion by combining the forces generated by the first engagement section of the first contact arm, the second engagement section of the first contact arm, the first resilient contact section of the first contact arm, the second resilient contact section of the first contact arm and the third resilient contact section of the first contact arm.

20. The method as recited in claim 19 comprising:
    engaging a first engagement section of the second contact arm with the first engagement section of the first contact arm to prevent further movement of the first engagement section;
    engaging a second engagement section of the second contact arm with the second engagement section of the first contact arm to prevent further movement of the second engagement section;
    moving a first resilient contact section of the second contact arm, a second resilient contact section of the second contact arm and a third resilient contact section of the second contact arm of the compliant portion to move independently of each other and independently of the first engagement section of the second contact arm and the second engagement section of the second contact arm;
    generating a total retention force of the compliant portion by combining the forces generated by the first engagement section of the first contact arm, the second engagement section of the first contact arm, the first resilient contact section of the first contact arm, the second resilient contact section of the first contact arm, the third resilient contact section of the first contact arm, the first engagement section of the second contact arm, the second engagement section of the second contact arm, the first resilient contact section of the second contact arm, the second resilient contact section of the second contact arm and the third resilient contact section of the second contact arm.

* * * * *